United States Patent [19]

LeBihan et al.

[11] Patent Number: 4,914,608
[45] Date of Patent: Apr. 3, 1990

[54] IN-VIVO METHOD FOR DETERMINING AND IMAGING TEMPERATURE OF AN OBJECT/SUBJECT FROM DIFFUSION COEFFICIENTS OBTAINED BY NUCLEAR MAGNETIC RESONANCE

[75] Inventors: Denis LeBihan, Rockville; Jose Delannoy, Chevy Chase; Ronald L. Levin, Silver Spring, all of Md.

[73] Assignee: The United States of America as represented by the Department of Health and Human Services, Washington, D.C.

[21] Appl. No.: 234,101

[22] Filed: Aug. 19, 1988

[51] Int. Cl.$^4$ .............................................. G01K 7/00
[52] U.S. Cl. ..................................... 364/557; 324/315
[58] Field of Search .......................... 364/413.13, 557; 324/315, 309

[56] References Cited

U.S. PATENT DOCUMENTS

| | | | |
|---|---|---|---|
| 4,558,279 | 12/1985 | Ackerman et al. | 324/315 |
| 4,780,674 | 10/1988 | Breton et al. | 324/309 |
| 4,809,701 | 3/1989 | LeBihan et al. | 128/653 |

FOREIGN PATENT DOCUMENTS

0221622  4/1987  Japan .

OTHER PUBLICATIONS

Gadian, D. G., Nuclear Magnetic Resonance and its Applications to Living systems, First Ed. Oxford Clarendon Press, pp. 23"42 (1982).

Moon, R. B., and Richards, J. H., Determination of Intracellular pH by 31$_p$ Magnetic Resonance, *J. Biological Chemistry* 218(20;7276–7278 (Oct. 25, 1973).

Holland, G. N. et al., 19$_F$ *Magnetic Reson. Imaging*, J. Magnetic Resonance 28:133–136 (1977).

Thomas, S. R. et al., Nuclear Magnetic Resonance Imaging Techniques Developed Modestly Within a University Medical Center Environment: What Can the Small System Contribute at this Point?, *Magnetic Resonance Imaging* 1(1):11–21 (1981).

Roberts, J. D., Studies of Conformational Equilibria and Equilibration by Nuclear Magnetic Resonance Spectroscopy, *Chem. in Britain*, 2:529–535 (1966).

(List continued on next page.)

*Primary Examiner*—Clark A. Jablon
*Attorney, Agent, or Firm*—Viviana Amzel; Glenna Hendricks

[57] ABSTRACT

A method of determining and imaging the temperature or temperature change of a liquid or solid object by NMR placing the object in a magnetic field $B_o$ at a temperature $T_o{}^i$, subjecting the object or a limited volume thereof to a first series of NMR imaging sequences to obtain first numerical values or images of molecular diffusion coefficients $D_o$ for individual points of the object or the limited volume thereof and recording the first series of images, maintaining the object or limited volume thereof at a temperature $T^i$ or waiting for a spontaneous change to the temperature, subjecting the object to a second series of magnetic resonance imaging sequences to obtain second numerical values or images of molecular diffusion coefficients $D^i$ for the same points of the object or the limited volume thereof and recording the second series of images, comparing point-by point the values or images of the diffusion coefficients $D_o{}^i$ with the values or images of the diffusion coefficients $D^i$ to generate a third series of values or images representing temperature changes $dT_i$ and recording the third series of images for each point of the object or limited volume thereof from the formula $$dT_i = (kT_o{}^2/E) \text{Log}(D/D_o)_i$$

wherein k is Boltzman's constant (1.38 $10^{-23}$ J/K) and E is the activation energy ($\approx$0.2 eV at 20° C.), provided $dT_i << T_o{}^i$ and $E \approx$ constant, repeating the steps for different points of the object to monitor temperature changes $dT_i$ at the various points, and determining the absolute temperature $T_o{}^i$ for each measured point of the object or limited volume thereof and obtaining the absolute temperature $T^i$ for each measured point from the formula $T^i = T_o{}^i + dT_i$.

19 Claims, 2 Drawing Sheets

OTHER PUBLICATIONS

Homer, J. and Thomas, L. F.: Nuclear Magnetic Resonance Spectra of Cyclic Fluorocarbons, *Trans. Faraday Soc.*, 59:2431–2443 (1963).

Sternhell, S. Kinetic $^{13}$C NMR Thermometer, Texas A&M U. NMR Newsleter, 285:21–23 (Jun. 1982).

Bornais, Jr. and Browstein, S., A Low Temperature Thermometer for $^1$H, $^{19}$F and $^{13}$C, *J. Magnet. Reson.* 29:207–211 (1978).

Gibbs, F. A., Hyperthermic Oncology, eds. Taylor and Frances, Phila, pp. 2155–2167 (1984).

Hahn, G. M., Hyperthermia in Cancer, Planum Press (New York, 1982).

Parker, D. L., Smith, V., Shelton, P., "Temperature Distribution Measurements in Two-Dimensional NMR Imaging", *Med. Phys.* 10:321 (1983).

Dickinson, R. J., Hall, A. S., Hinde, A. J., Young, I. R., "Measurement of Changes in Tissue Temperature Using MR Imaging", *J. Comput. Assist. Tomogr.* 10:468 (1986).

Lauterbur, P. C. (1975), Nature 18,69–83).

Lewa, C. J., Majeska, Z., *Bull. Cancer (Paris)* 67:525–530 (1980).

Parker, D. L., supra; Dickinson, R. J., supra.

Dickinson, R. J., Hall, A. S., Hinde, A. J., and Young, I. R., supra; U.S. Pat. No. 4,558,279.

Bottomley, P. A., Foster, T. H., Argensinger, R. E., Pfeifer, L. M., *Med. Phys II* 425–448 (1984).

Young, I. R., Bryant, D. J. and Payne, J. A. Magn. Res. Med. 2:355–389 (1985).

Hall, L. D., Reson. 65:501–505 (1983).

George et al., "Translation on Molecular Self-Diffusion in magnetic Resonance Imaging: Effects and Application", in Biomedical Magnetic Resonance, published by Radiology Research and Education Foundation, San Francisco 1984.

LeBihan, D., "Intravoxel Incoherent Motion Imaging Using Steady-State Free Presession", Magnetic Resonance in Medicine 7:346 (1988).

Fig. 2

IN-VIVO METHOD FOR DETERMINING AND IMAGING TEMPERATURE OF AN OBJECT/SUBJECT FROM DIFFUSION COEFFICIENTS OBTAINED BY NUCLEAR MAGNETIC RESONANCE

BACKGROUND OF THE INVENTION

Technical Field

The application of nuclear magnetic resonance (NMR) to the study and imaging of intact biological systems is relatively new. Like X-rays and ultrasound procedures, NMR is a non-invasive analytical technique which can be employed to examine lining tissues. Unlike X-rays, however, NMR is a non-ionizing, non-destructive process that can be employed continuously to a host. Further, NMR imaging is capable of providing anatomical information comparable to that supplied by X-ray CAT scans in any orientation without patient discomfort. On the other hand, the quality of projections or images reconstructed from currently known NMR techniques either rival or transcend those observed with ultrasound procedures. Thus NMR has the potential to be one of the most versatile and useful diagnosing tools ever used in biological and medical communities today.

NMR occurs when nuclei with magnetic moments are subjected to a magnetic field. If electromagnetic radiation in the radio-frequency region of the spectrum is subsequently applied, the magnetized nuclei emit a detectable signal having a frequency similar to the one applied.

Many nuclei have intrinsic magnetism resulting from its angular momentum, or spin, of such nuclei. Resembling a bar magnet, the spin property generates a magnetic dipole, or magnetic moment, around such nuclei. Thus, when two external fields are applied to an object the strong magnetic field causes the dipoles for such nuclei, e.g., nuclei with spin designated 1/1, to align either parallel or anti-parallel with said magnetic field. Of the two orientations, the parallel alignment requires the nuclei to store less energy and hence is the more stable or preferred orientation. The second applied field comprises radio-frequency waves of a precise frequency or quantum of electromagnetic radiation. These waves cause such nuclei to nutate or flip into a less stable orientation. In an attempt to re-establish the preferred parallel or stable orientation, the excited nuclei will emit electromagnetic radio waves at a frequency nominally proportional to the magnitude of the strong field, but specifically characteristic of their chemical environment.

NMR technology therefore detects radio-frequency signals emitted from nuclei as a result of a process undergone by the nuclei when exposed to at least two externally applied fields. If a third magnetic field in the form of a gradient is applied, nuclei with the same magnetogyric constant will nutate at different frequencies, i.e., Larmor frequencies, depending upon the location within the object. Thus, similar nuclei in an object can be detected discriminately for a particular region in said object according to their Larmor frequency corresponding to a particular magnetic field strength along the applied magnetic gradient, as demonstrated by the following equation $$f_o = \gamma H_o$$

wherein $f_o$ is the Larmor frequency, $\gamma$ is the magnetogyric constant, and $H_o$ is the applied magnetic field.

Several factors, however, limit the usefulness of NMR applications in vivo. In general, NMR is an insensitive radiologic modality requiring significant amounts of nuclei with magnetic moments to be present in an object. Consequently, not all nuclei in vivo are present in sufficient quantities to be detected by present NMR techniques. Further, not all nuclei found in vivo have magnetic moments. Some of the more common isotopes that do not have magnetic moments which are found in vivo include $^{12}C$, $^{16}O$ and $^{32}S$.

Thus, current NMR applications in vivo are restricted to those nuclei that have magnetic moments and are sufficiently abundant to overcome the insensitivity of present NMR techniques. For the most part, in vivo NMR applications almost invariably concern themselves with imaging or detecting the water distribution within a region of interest derived from the detection of proton resonance. Other nuclei not only have lower intrinsic NMR sensitivities but are also less abundant in biological material. Consideration has been given, however, to the use of other nuclei such as $^{31}P$ which represents the next best choice for NMR in vivo applications to its natural and abundant occurrence in biological fluids. For example, $^{31}P$ NMR has been found to provide an indirect means for determining intracellular pH and $Mg^{++}$ concentration simply by measuring the chemical shift of the inorganic phosphate resonance in vivo and determining from a standard titration curve the pH or $Mg^{++}$ concentration to which the chemical shift corresponds. (Gadian, D. G., Nuclear Magnetic Resonance and its Applications to Living Systems, First Ed. Oxford Clarendon Press, pp. 23–42 (1982); Moon, R. B. and Richards, J. H., Determination of Intracellular pH by $31_P$ Magnetic Resonance. J. Biological Chemistry 218(20;7276–7278 (Oct. 25, 1973)). In addition, $23_{Na}$ has been used to image a heart perfused with a medium containing 145 mM sodium in vivo. Difficulties with these nuclei arise because of inherent sensitivity losses due to the lower resonant frequencies of these nuclei (Moon, R. B. and Richards, J. H., Determination of Intracellular pH by $^{31}P$ Magnetic Resonance, J. Biol. Chem. 218(20):7276–7278 (Oct. 25, 1973).

Another stable element which is uniquely suited for NMR imaging is F because its intrinsic sensitivity practically commensurates with that of protons, it has a spin of ½ so as to give relatively uncomplicated, well resolved spectra, its natural isotopic abundance is 100 percent, it gives large chemical shifts, and its magnetogyric constant is similar to that of protons. Accordingly, the same equipment used for proton NMR can be used in vivo. However, F NMR applications are not used due to practical non-existence in biological materials of fluorine observable by NMR methods normally employed in studying biological systems. However, nuclear medicine procedures using a $18_F$ positron emitter are well documented and include, for example, bone scanning, brain metabolism and infarct investigations using fluorodeoxyglucose, and myocardial blood flow and metabolism. Suggestions have been presented involving the study of vascular system disorders with F imaging (Holland, G. N. et al, $^{19}F$ Magnetic Reson. Imaging, J. Magnetic Resonance 28:133–136 (1977)) and the localization/kinetics of fluorocarbon following liquid breathing. Further, in vitro canine studies investigating the feasibility of fluorine as an agent for NMR imaging of myocardial infarction have also been performed (Thomas, S. R. et al, Nuclear Magnetic Resonance Imaging Techniques Developed Modestly Within a University Medical Center Environment: What Can the Small System Contribute at this Point?, Magnetic Resonance Imaging 1(1):11–21 (1981)).

Studies directed to conformational equilibria and equilibration by NMR spectroscopy have been conducted, particularly with cyclohexane and fluorocyclohexane rings. In such applications, the position of the equilibria between conformational isomers and measurements of rates of equilibration of such isomers as a function of temperature have been determined. The studies, however, were dependent upon the implementation of known temperatures to determine the equilibria and equilibrium rates (Roberts, J. D., Studies of Conformational Equilibria and Equilibration by Nuclear Magnetic Resonance Spectroscopy, Chem. in Britain. 2:529–535 (1966); Homer, J. and Thomas, L. F.: Nuclear Magnetic Resonance Spectra of Cyclic Fluorocarbons. Trans. Faraday Soc. 59:2431–2443 (1963)). It has further been illustrated that $^{13}C$ may be employed as a kinetic thermometer in a laboratory environment. This particular application requires the examination system to contain at least two chemically exchanging sites which correspond to one exchange process and an independent means of determining the kinetic parameters describing the exchange process in order for $^{13}C$ to serve as a kinetic thermometer. Such application, however, is limited to determining temperature at coalescence and is, thus, operable at only one temperature for each independent exchange process as opposed to over a continuous range. The method is further employed as a calibration technique and its accuracy is inherently unreliable to be of practical significance (Sternhell, S. Kinetic $^{13}C$ NMR Thermometer, Texas A&M U. NMR Newsletter. 285:21–23 (June 1982)). Unfortunately, NMR studies based on $^{13}F$ or $^{13}C$ require infusion in the body of molecules containing these atoms due to their very low abundance in vivo.

Temperature has been measured by means of the NMR spectrum of liquid samples for the purpose of calibrating the temperature control apparatus of an NMR spectrometer. Many features of the NMR spectrum, for instance chemical shifts, often show weak temperature dependence, and could be used to determine temperature (Bornais, Jr. and Browstein, S., A Low-Temperature Thermometer for $^1H$, $^{19}F$ and $^{13}C$, J. Magnet. Reson. 29:207–211 (1978)). The peak separation and spin-spin coupling in the proton NMR spectrum of a liquid test sample changed by 1.75 Hz and 0.07 Hz, respectively, when the temperature was varied by 10.5° C. In objects, such as animals, were the best obtainable spectral resolution could be 10 to 50 Hz or larger, and it is desired to measure temperatures to an accuracy of 1° C. or 2° C. or better, such as means of temperature measurement is inapplicable.

As to temperature in an animal, it is well known that abnormal fluctuations in temperature such as increases may reflect infection or hyperthermia, while decreases may represent ischemia or hypothermia. Thus, it is useful to measure temperature in an animal accurately, inexpensively and reliably. Furthermore, induced hyperthermia can also be used as an adjunctive cancer treatment.

In the past, temperature measurements have generally consisted of invasive and cumbersome techniques that often result in less than reliable measurements. Examples of such techniques comprise invading needles, electrical wires, cables, or instruments that must be inserted into a region of interest. Such penetrating procedures possess unfortunately the potential to cause chemical and biological contamination to the host. Thus, proper preparation and sterilization procedures are required to prevent transmittal and corrosive contamination when the instruments to detect temperature are reused. Another disadvantage inherent to the conventional techniques concerns the discomfort and inconvenience experienced from communication with penetrating probes. As to highly delicate structures, the temperature may be obtained but not without sacrifice to the integrity of the structure. Generally, the structure may be damaged, repositioned or its dimensions changed. Short circuiting of the employed instruments may add additional expenses and time to the procedure. The instrument itself when exposed to physical and chemical extremes may interfere with its reliability. Moreover, conventional techniques are unable to measure a continuous temperature field in an object or animal and, thus, the invasive and cumbersome procedure must be duplicated for each time or at each point in space a temperature measurement is desired, or employ simultaneously a large number of temperature sensors.

Non-invasive and non-destructive temperature imaging in biological systems may be useful in many disciplines. One important application is clinical hyperthermia (HT) which is being used as an adjunctive cancer treatment (Hahn, G. M., infra) Although very promising results have been obtained, the effectiveness and safety of deep-seated HT treatment has been limited, mainly due to a lack of temperature control (Gibbs, F. A., Hyperthermia Oncology, eds. Taylor and Frances, Phila, pp 2155–167 (1984)). Indeed, the effectiveness of a HT treatment depends upon the minimum temperature reached in the tumor (greater than 42° C.) while safety considerations limit the maximum temperature that can be reached in normal healthy tissues (less than 42° C.) (Hahn, G. M., Hyperthermia in Cancer, Planum Press (New York, 1982)). The temperature must be, therefore, monitored throughout the entire heated region with at least one cm spacial resolution and 1° C. sensitivity (Hahn, G. M., supra).

A method to conduct non-invasive temperature monitoring by magnetic resonance imaging (MRI) was recently proposed which employs Tl temperature dependency (Parker D. L., Smith, V., Shelton, P., Med. Phys. 10:321 (1983); Dickinson, R. J., Hall, A. S., Hinde, A. J., Young, I. R., J. Comput. Assist. Tomogr. 10:468 (1986); U.S. Pat. No. 4,558,279 to Ackerman et al). MRI, a non-invasive and non-ionizing imaging method (Lauterbur, P. C. (1975) Nature 18,69–83) has the advantage of producing anatomical images of any part of the body in any orientation with high resolution. Contrast in MRI is defined by parameters mainly related to certain physical properties of water molecules. Temperature sensitivity of one of these parameters, namely, the spin-lattice relaxation time or Tl has been demonstrated in-vitro for different biological systems thereby suggesting the thermal imaging potentiality of MRI (Lewa, C. J., Majeska, Z., Bull. Cancer (Paris) 67:525–530 (1980) Parker, D. L., supra; Dickinson, R. J., supra). However, in general, precise Tl MRI measurements are difficult and the accuracy for temperature determination is limited. In most cases the accuracy is no greater than 2° C./cm/5 min acquisition time. (Parker D. L., Smith V. and Shelton P., supra; Dickinson R. J., Hall A. S., Hinde A. J., and Young I. R., supra; U.S. Pat. No. 4,558,279).

Unfortunately, there are large variations in T1 between different tissues and for the same tissue between different subjects. This has been ascribed to the multi-factorial nature of T1 (Bottomley, P. A., Foster, T. H., Argensinger, R. E., Pfeifer, L. M., Med. Phys II: 425–448 (1984). The applicability of this technique seems therefore to be limited because a relative change of at least 1% in R1 is needed to detect a 1° C. change in temperature (Cetas, E. C., supra) and $T_1$ measurements using MRI are difficult due to its sensitivity to environment (Young, I. R., Bryant, D. J. and Payne, J. A. Magn Res. Med. 2:355–389 (1985). U.S. Pat. Nos. 4,319,190, 4,558,279 and 4,361,807 also disclose methods of imaging chemical shifts in a body. However, these methods were not directly applied to the indirect measurement of temperatures in vivo. The use of chemical-shift resolved MRI has also been experimentally proposed but has severe limitations (Hall, L. D., Reson. 65:501–505 (1983)). Furthermore, all these techniques have failed for temperature monitoring in vivo, so that NMR was not considered as a likely temperature imaging method.

A variety of methods are available in the prior art for measuring the diffusion constant of the regents of a medium. One is that described by George et al "Translation on Molecular Self-Diffusion in Magnetic Resonance Imaging: Effects and Applications", in Biomedical Magnetic Resonance, published by Radiology Research and Education Foundation, San Francisco 1984. This method describes the measurement of the diffusion constant by comparing the relative effect of the diffusion of the studied medium and on a standard substance during different magnetic excitation sequences. This method relies on increasing the intensity of a section selection gradient which modifies the thickness of the studied section. Thus, this method can only be applied to objects which are finer than the finest section thickness obtained by sequences used and practically of not use in animal or human subjects. The sensitivity of this method to diffusion is also relatively limited.

Another method which lends itself to the measurement of temperatures in living tissues, including animals and humans utilizes relatively long echo times and effective gradients as a result of their intensity and position. In addition the exact determination of diffusion coefficients is obtained without a standard substance by basing the calculations on acquisition parameters. This method is described in a patent application entitled "Process for Imaging by Nuclear Magnetic Resonance" filed by Breton, E. A., LeBihan, D. and LeRoux, P. in France on June 27, 1985 (FR 85 09824) and in the U.S. on Dec. 24, 1986 under a Ser. No. 06/946,034, now U.S. Pat. No. 4,780,674, which is a Continuation-in-Part of U.S. application Ser. No. 823,522 filed Jan. 29, 1986, now abandoned the entire contents of which are incorporated herein by reference, with particular emphasis on the characteristics and steps of the method such as the utilization of basic sequences using Spin-Echoes to measure and image diffusion and longer and/or more powerful field gradient pulses to eliminate the effects of blood microcirculation.

An additional method is described in French patent application No. 86 13483 entitled "Method of Imaging by Nuclear Magnetic Resonance" by Breton, E. A., and LeBihan, D. on Sept. 26, 1986. This application was also later filed in the EPO on Sept. 21, 1987, in Japan on Sept. 25, 1987 and in the U.S. with a Ser. No. 07/100,261 on Sept. 23, 1987, now U.S. Pat. No. 4,809,701. These patent applications describe improvements in diffusion measurements and images which can be obtained when NMR excitation sequences and recording of NMR signals by synchronization with heart beats in living tissues. Diffusion measurements and images can be obtained quickly by using Steady-State Free Precession NMR. Yet another method is described in a patent application entitled "Precede and Imagerie des Movements Intravoxels par RMN dans in corps" filed in France by LeBihan, D. on Oct. 13, 1987 and has a Ser. No. 87 14098. This patent application contains an invention which is related to the publication LeBihan, D., "Intravoxel Incoherent Motion Imaging Using Steady-State Free Presession", Magnetic Resonance in Medicine 7:346 (1988). This is a method for the fast imaging of diffusion by using Steady State Free Precision NMR. The entire contents of the patent application and the above article are also incorporated herein by reference.

In view of the foregoing description of the limitations posed by prior art NMR temperature measuring techniques there is a clear need in the art, with particularly imminent application to cancer treatments for an improved method of determining in vivo the temperature coefficient and obtaining temperature images which is safe, non-invasive and can provide the sensitivity and reliability required of such measurements.

SUMMARY OF THE INVENTION

This invention relates to a novel and improved method of determining and imaging the temperature or the temperature change of an object (human, animal, liquid or solid) by nuclear magnetic resonance of molecular diffusion coefficients, said method comprising (a) placing the object in a magnetic field Bo at a temperature To;

(b) subjecting the thus positioned object to a first series of magnetic resonance imaging sequences able to give first numerical values or images of molecular diffusion coefficients, namely Do for individual points of the object or of a limited volume thereof;

(c) maintaining the object or a part thereof utilized in step (b) to a temperature T, or waiting for a spontaneous change to a temperature T in said part;

(d) subjecting the thus positioned object to a second series of magnetic resonance imaging sequences to obtain second numerical values or images of molecular diffusion coefficients, namely D, for individual points of the object or of a limited volume thereof;

(e) comparing point-by-point the values of the diffusion coefficients Do allocated for the first series of diffusion images obtained in step (b) with the values of the diffusion coefficients D obtained in the second series of diffusion images in step (d) in order to determine and to generate a third series of images representing temperature changes dT between steps (b) and (d) for individual point i of the object or of a limited volume of the object from the formula $dT_i = (kTo/E) \text{Log}(D/Do)_i$ wherein k is Boltzman's constant (1.38 $10^{-23}$ J/K) and E is the activation energy ($\approx$0.2 eV at 20° C.), provided dT $<<$ To and E$\approx$constant, (f) repeating steps (c) to (e) continuously for different points of the object so that temperature changes $dT_i$ can be monitored continuously, (g) determining the absolute temperature To for individual points of the entire object or of a limited volume thereof so that by repeating steps (b) to (f) the absolute temperature T can be determined and imaged continuously in each point of the object or of a limited volume of the object from the formula $$T = T_o + dT_i$$

wherein Dt is determined and imaged in step (e).

The present method may be utilized to determine the temperature of a subject also receiving, e.g., cancer therapy, or other treatments where the temperature of the body or of a particular portion of the body is bound to be varied. The method of this invention is highly sensitive to changes in temperature, accurate, non-invasive and provides a sensitivity for the measurement of temperature which is greater than 2% in the resolution of the temperature images better than 0.5° C.

A more complete appreciation of the invention and many of the attendant advantages thereof will be readily perceived as the same becomes better understood by reference to the following detailed description when considered in connection with the accompanying figure.

Other objects, advantages and features of the present invention will become apparent to those skilled in the art from the following discussion.

BEST MODE FOR CARRYING OUT THE INVENTION

The present invention arose from a desire to improve on prior methods for the determination of body temperature, particularly associated with hyperthermia (HT) which is used as an adjunctive cancer treatment. In general, the effectiveness of HT treatments depend upon reaching a minimum temperature in a tumor, e.g., mostly greater than 42° C., while for all practical purposes temperatures greater than 42° C. are not really permissable in normal healthy tissues. Therefore, the temperatures applied during treatment must be thoroughly and accurately monitored throughout the application of a treatment in the heated areas of the body within at least 1 cm spacial resolution and 1° C. sensitivity. This degree of sensitivity and accuracy has not been attained by prior non-invasive methods currently available.

The inventors discovered that by using molecular diffusion measurable by nuclear magnetic resonance (NMR) techniques they could measure an image body temperature. A relationship between the diffusion coefficients and temperature known in the art is utilized as applied to the measurement of body temperature. In addition, this invention also incorporates available methods for quantitative diffusion imaging using MRI (LeBihan D., Breton E., Lallemand D, Grenier P., Cabanis E. and Laval-Jeantet M., supra; Taylor D. G. and Bushell M. C., Phys. Med. Biol. 30:345 (1985)); LeBihan, D., Breton, E. (1985) C. R. Acad. Sc, supra; LeBihan, D., Breton, E., Lallemand, D., Grenier, P., Cabanis, E., Laval Jeantet, M., Radiology 1986, supra; LeBihan, D., Magn, Reson. Med., 1988, supra; Taylor, D. G., Bushell, M. C. (1985) Phys. Med. Biol. 30,345–349; Merkolt, K. D., Manicke, W., Frahm, J., J. Magn. Reson (1985).

The present method is based on the following theoretical considerations.

The following temperature dependence of the translational self-diffusion coefficient D and viscosity are established on the basis of the Stokes-Einstein relationship (Simpson, J. H. and Carr H. Y., Phys. Rev. 111:1401 (1958)).

$$D \alpha \sim \exp(-E/kT) \quad (1)$$

wherein k is Boltzman's constant (1.38 $^{10}$23 J/°K$\beta$ and E is the activation energy No. 2 eV at 20° C., Simpson et al, supra).

Thus, it can be stated that when an object is subjected to changing temperatures, these temperature changes induce changes in the diffusion coefficient which can be calculated from differentiating the equation (1) above as long as the variations of E with T are small, as follows.

$$dD/D = (E/kT)dT/T \quad (2)$$

As can be seen from equation (2) above temperature changes may be detected from diffusion coefficient measurements. This permits the application of magnetic resonance technology of the measurement of diffusion coefficients to the temperature of the object subjected to the magnetic field.

A map of temperature changes $(T-T_o)_{xy}$ can thus be obtained by the method of the invention from two diffusion images $D_{x,y}$ and $D_{o\,x,y}$. The first image is obtained before heating $(T_o, D_o)$ and the second is obtained during heating at a temperature T (T, D). The two sets of data can be correlated as follows.

$$(T - T_o)_{x,y} = (kT_o^2/E) \text{Log} (D/D_o)_{xy} \quad (3)$$

provided that $T - T_o < T_o$ in that $E \approx \sim$ constant.

Diffusion coefficients of hydrogen nuclei in water can be measured and imaged using MRI for instance, (LeBihan, D., Breton, E., C. R. Acad, supra; (LeBihan, D., Breton, E., C. R. Acad. Sc (Paris) 301, 1109–1112 (1985) LeBihan, D. Breton, E. Lallemand, D., Cabanis, E., Laval-Jeantet supra)) The effect of molecular diffusion in the presence of a magnetic field gradient on MR spin-echo signals was described long ago (Hahn, E. L., Phys. Rev. 80:580 (1950). Diffusion produces a pure amplitude attenuation of the MR signal due to the loss of phase coherence between processing spins produced by their random walk through the gradient. This amplitude attenuation A depends only on the diffusion coefficient D and the gradient so that $$A = \exp(-b \cdot D) \quad (4)$$

where b is a gradient factor which can be calculated from gradient characteristics (strength and duration) (LeBihan, D., Breton, E. A., C. R. Acad-Sc, (1985) supra; LeBihan, D. Breton, E., Lallamond, D., Grenier, P., Cabanis, E., Laval-Jeantet, M., supra; Hahn, E. L., supra; Carr, Y. Y. and Purcell E. M. supra; Stejskal, E. Tanner J. E., J. Chem. Phys 42:288 (1965)).

Stejskal and Tanner, supra, introduced a diffusion measurement method that used pulsed magnetic field gradients, thereby improving the sensitivity of the measurements and allowing smaller values of diffusion coefficients to be determined. More recently, these concepts were extended to MRI (LeBihan, D., Breton, E., Lallemand, D., Grenier, P., Cabanis, E. and Laval-Jeantet, M. supra) and applied to a diffusion mapping method based on two MR images differently sensitized to diffusion by the presence of specially designed gradient pulses (LeBihan, D., Breton, E., Lallemand, D., Grenier, P., Cabanis, E and Laval-Jeantet, M, supra; LeBihan, A. and Breton, E. Under these conditions, the diffusion image is derived from $$D_{x,y} = \text{Log}(A_{2x,y}/A_{1x,y})/(b_1-b_2) \quad (5)$$

where $b_1$ and $b_2$ are the calculated factors in both images, and $A_2/A_1$ is the amplitude attenuation ratio equal to the signal amplitude ratio of both images because both images are identical with respect to all the other MRI parameters.

The method of the invention has been tested at different temperatures which are permissive to the human body. One such test is provided in the example herebelow. These tests demonstrate the ability of MRI to measure temperature changes using molecular diffusion imaging.

The sensitivity of the present method for temperature determination using diffusion is at least twice that of available prior art procedures using T1 (Parker, D. L., Smith, V., Shelton, P.; supra; Dickinson, R. J., Hall, A. S., Hind, A. J., Young, I. R., supra: Bottomley, P. S., Forster, T. H. Argersinger, R. E. and Pfeifer, supra; U.S. Pat. No. 4,558,279.

This increased sensitivity may be ascribed to the basis relationship between diffusion, T1, and temperature. T1 relaxation depends in part on diffusional processes. However, in biological tissues, the diffusion term that predominates in T1 is rotational diffusion which is 1.5 times less sensitive to temperature than translation diffusion (Abrogam, A., Principle Nuclear Magnetism (Oxford U. Press., London) (1961).

Furthermore, there are other contributions to T1 so that its temperature dependance may not be simple (Abrogam, E. O., supra).

In addition, T1 determinations using MRI are often inaccurate because of difficulties in obtaining homogeneous MR radiofrequency fields through the imaged slice (Young, I. R., Bryant, D. J. and Payne, J. A., Magn. Reson. Med. 2:355–389 (1985). These difficulties disappear when using the present diffusion imaging method because it uses two MR imaging sequences identical as far as the radiofrequency field is concerned LeBihan, D., Breton, E, (1985) supra; (LeBihan, D., Breton, E., Lallemand, D., Grenier, P. Cabanis, E. and Laval-Jeantet, M. supra; LeBihan, D. and Breton, E., supra) Under these conditions, the signal imperfections will cancel each other.

This method can be applied in-vitro and in-vivo for instance during clinical hyperthermia treatments. Moreover, the relationship of equation (3) between T and D applies to biological tissues as well as the material of the sample in biological tissues. Measured diffusion coefficients can be affected by restricted diffusion phenomena related to compartmental effects on water mobility (Stejskal, E. D., J. Chem Phys. 43:3597 (1965). Moreover, the non-Brownian character of restricted diffusion may affect its relation with temperature. However, restricted diffusion effects are limited if necessary by shortening the diffusion measurement times (echo time TE).

Furthermore, the use of Eq.(3) for temperature measurement assumes the previous determination of the activation energy E in biological tissues, that there is a smaller variation in E between the same tissue in different subjects, and that there are substantially no hysteresis effects when the temperature increases up to 42° C. and then decreases back to 37° C. contrary to what was found for the temperature dependance of T1 (Lewa, C. J., Majeska, Z., Bull Cancer (Paris) 67:515–530 (1980)).

In vivo diffusion coefficients should be measured with extreme care. These measurements may be affected by other intravoxel incoherent motions of water present in biological tissues as well known in the art (LeBihan, D., Breton, E., Lallemand, D., Grenier, P, Cabanis, E. and Laval-Jeantet, M., supra). In particular, the separation of the contributions of diffusion from that of blood microcirculation must be achieved using a known appropriate algorithm (LeBihan, D., Breton, E., Lallemand, D., Aubin, M. L., Vignaud, J. and Laval-Jeantet, M., Radiology 186:497 (1988). On the other hand perfusion imaging may be very useful in hyperthermia studies, blood circulation having an important role in thermal clearance (Hahn, G. M., Physics and Technology of Hyperthermia pp. 441–447, Martinus Nijhoff Publishers, Boston). However, other NMR methods able to generate diffusion images can be used for temperature imaging, for instance, methods using stimulated echoes (Merboldt, K. D., Manicke, W., Maase, A. J., Magn. Reson 64:81 (1985) or methods using Steady-State Free Precession (LeBihan, D.) Magnetic Resonance in Medicine 7, 346–351, 1988).

More specifically, the method of the invention is a method of determining and imaging the temperature or the temperature change of an object (human, animal, liquid or solid) by nuclear magnetic resonance of molecular diffusion coefficients which comprises (a) placing the object in a magnetic field Bo at a temperature To;

(b) subjecting the thus positioned object to a first series of magnetic resonance imaging sequences to obtain first numerical values or images of molecular diffusion coefficients $D_o^i$ for various points of the object or of a limited volume thereof;

(c) maintaining the object or part of the object including the points measured in step (b) at a temperature or waiting for a spontaneous change to said temperature T in said part of the object;

(d) subjecting the thus positioned object to a second series of magnetic resonance imaging sequences to obtain values or images of molecular diffusion coefficients $D^i$ for the same points of the object or of a limited volume thereof measured in step (b);

(e) comparing point-by-point the values of the diffusion coefficients Do allocated for the first series measured in step (b) with the values of the diffusion coefficients $D^i$ obtained in the second series obtained in step (d) in order to determine and to generate a third series of images representing temperature changes $dT_i$ between steps (b) and (d) for each point of the object or of a limited volume of the object measured in steps (b) and (d) from the formula $$dT_i = (kTo^2/E) \text{ Log } (D/Do)_i$$

wherein k is Boltzman's constant ($1.38 \cdot 10^{-23}$ J/K) and E is the activation energy ($\approx 0.2$ eV at 20° C.), provided $dT \ll To$ and $E \approx$ constant;

(f) repeating steps (c) to (e) continuously so that temperature changes $dT_i$ can be monitored continuously;

(g) determining the absolute temperature $T^i{}_0$ for each measured point of the object or of a limited volume of the object so that by repeating steps (b) to (f) the absolute temperature $T^i$ can be determined and volume thereof from the formula $$T^i = T^i{}_0 + dT_i$$

where dT is determined and imaged in step (e).

In a particularly useful embodiment of the method of the invention the magnetic field utilized is a constant magnetic field. Particularly suitable values for the magnetic field are about 0.2 T to 10 T and more preferably, 0.1 T to 2 T. However, other values may also be utilized.

Suitable temperatures $T_o$ to which the subject/object is exposed when practicing the present invention are (for water) from 0 to 100° C., and more preferably 25 to 45° C. The measurements can be attained at ambient temperature as well.

In yet another particularly embodiment of the method, the series of magnetic resonance imaging sequences used to obtain measurements and images of molecular diffusion can be Spin-Echo sequences, Stimulated Echo sequences or Steady-State Free Precession sequences using gradient-recalled echoes.

The method using Spin-Echoes is described in U.S. application Ser. No. 946,034 filed on Dec. 24, 1986 and in LeBihan D. and Breton E., supra; LeBihan D., Breton, E., Lallemand D., Grenier P., Cabanis E., now U.S. Pat. No. 4,780,674 Laval-Jeantet M., supra the entire contents of which are incorporated herein by reference.

The method using Stimulated Echoes is described in Merboldt, K. D., Manicke W., Frahm J., J. Magn. Reson. 64:479-486 (1985), the entire contents of which is incorporated herein by reference.

The method using Steady-State Free Precession is described in French application Ser. No. 8714098 filed on Oct. 13, 1987, and in LeBihan, D., Magn. Reson. Med., 7:346 (1988) the entire contents of which are also incorporated herein by reference.

In a particular embodiment of the method of the invention, the calculation of the diffusion coefficients D and Do from Nuclear Magnetic Resonance sequences, as described for in the Spin-Echo method, the Stimulated Echo method and the Steady-State Free Precession method, can also be programmed and substituted directly into the general formula for the temperature shown as equation (3) to obtain the latter values directly and automatically.

In still another particular embodiment of the method, the effects of blood microcirculation in living tissues can be eliminated and/or separated from the diffusion measurements using the Spin-Echo method, the Stimulated Echo method or the Steady-State Free Precession method by using sequences with longer and/more powerful gradient pulses, described in U.S. application Ser. No. 946,034 filed on Dec. 24, 1986 now U.S. Pat. No. 4,780,674 and French application Ser. No. 8714098 filed on Oct. 13, 1987 and in LeBihan, D., Breton, E., Lallemand, D., Aubin, M. L., Vignaud, J., Laval-Jeantet, M., supra, the entire contents of which are incorporated herein by reference.

In another particular embodiment of the method, the effects of blood pulsations in diffusion measurements and images are eliminated in living tissues by a synchronization of the NMR excitation sequences and recording of NMR signals with the heart beats of the living objects, as described in U.S. patent application Ser. No. 100,261, now U.S. Pat. No. 4,809,701 the entire contents of which are incorporated hereby by reference.

In another embodiment of the method, the diffusion and derived temperature measurements and images are obtained in any part of the object, in any orientation and one-, two-, three dimensions.

In a particular useful embodiment of the invention, the method is conducted in a manner such that steps (b), (d) and (e) are conducted with the aid of a computer program. If the NMR apparatus is connected to a computer and appropriate software is in place the calculations encompassed by the method may be conducted automatically and a plot of temperature vs. location in a three dimensional space may be produced automatically.

In another particularly useful embodiment of the method, the diffusion coefficients measurements and images, and their derived temperature measurements and images can be obtained from other molecules than water, although water is preferably used. The method can be applied to any molecule which can be studies by NMR. For instance, but non limitatively, molecules containing hydrogen such as fat or lactates can be used. Similarly, compounds containing $^{31}F$, $^{23}Na$, $^{13}C$ or $^{19}F$, among others, can be used (see references in "Technical Filed" section hereabove).

The method of the invention may be applied to the indirect determination of temperatures in objects and subjects such as animals, and more preferably humans. The diffusion images obtained can translate into temperature maps with an accuracy of less than 1 cm and a temperature certainty greater than 0.5° C. No prior art method has attained these values.

Having now generally described this invention, the same will be better understood by reference to a specific example, which is included herein for purposes of illustration only and is not intended to be limiting of the invention or any embodiment thereof, unless so specified.

EXAMPLES

Diffusion values and the corresponding temperature images are obtained on a 0.5 Tesla whole-body MRI system (Thompson-CGR Magniscan 5000) working at 21 MHz. The tests are conducted to validate equation (3) above, representing the mathematical basis of the method of the invention and to check the sensitivity of the present MRI diffusion method for non-invasive in-vivo temperature measurements.

A phantom is designed to have MRI parameters close to those of biological tissues with respect to water content, relaxation times, and diffusion coefficient. It consists of a polyacrylamide gel (7.5 wt % polyacrylamide) doped with 5 mM copper (II) sulfate contained in a cubic Plexiglas$^R$ box (10 cm×10 cm×10 cm). The phantom is placed within the central homogeneous radiofrequency field of a 30 cm diameter imaging coil which is used as both NMR transmitter and receiver.

A temperature gradient of about 1° C./cm is induced between two opposite faces of the phantom in the direction of the main magnetic field. This thermal gradient is produced by water streams at two different temperatures circulating in compartments placed at opposite faces of the phantom. The phantom and the water compartments are encased in a block of polystyrene which affords thermal insulation. The temperatures are monitored using copper-constant thermocouples placed within catheters located along the direction of the induced thermal gradient. The temperatures $T_o$ and T are measured respectively before and during heating every 5 mm along the thermal gradient.

Diffusion images are obtained as previously described in LeBihan D., Breton, E., Lallemand, D., Grenier, P, Cabanis, E., Laval-Jeantet, M., Radiology 62:401 (1986); LeBihan, D. and Breton, F., C. R. Acad. Sc. (Paris) 301:1109 (1985); U.S. patent application Ser. No. 946,034 filed on Dec. 24, 1986 now U.S. Pat. No. 4,780,674 from two different diffusion sensitized spin-echo images (repetition time TR=800 ms, echo time TE=140 ms, 128×128 acquisition matrix) allowing images to be obtained with a 2 mm×2 mm spatial resolution. The acquisition time for each image is 3 min 25 s.

These diffusion images are calculated in real time from the spin-echo images according to equation (5) above using a computer program loaded on a DEC VAX 11/730 computer coupled with a MSP-3000 array processor. Diffusion images are obtained before and during the presence of the thermal gradient.

The relative changes in the diffusion coefficients D are then averaged from the diffusion images every 5 mm in the direction of the thermal gradient using 0.8 cm² regions of interest (ROI). The following two series of tests are performed.

(1) the first test is centered about room temperature (To=23.8° C.), and (2) the second test centered about normal body temperature (To=36.7° C.) at which the gel is first uniformly heated.

Figure 1:
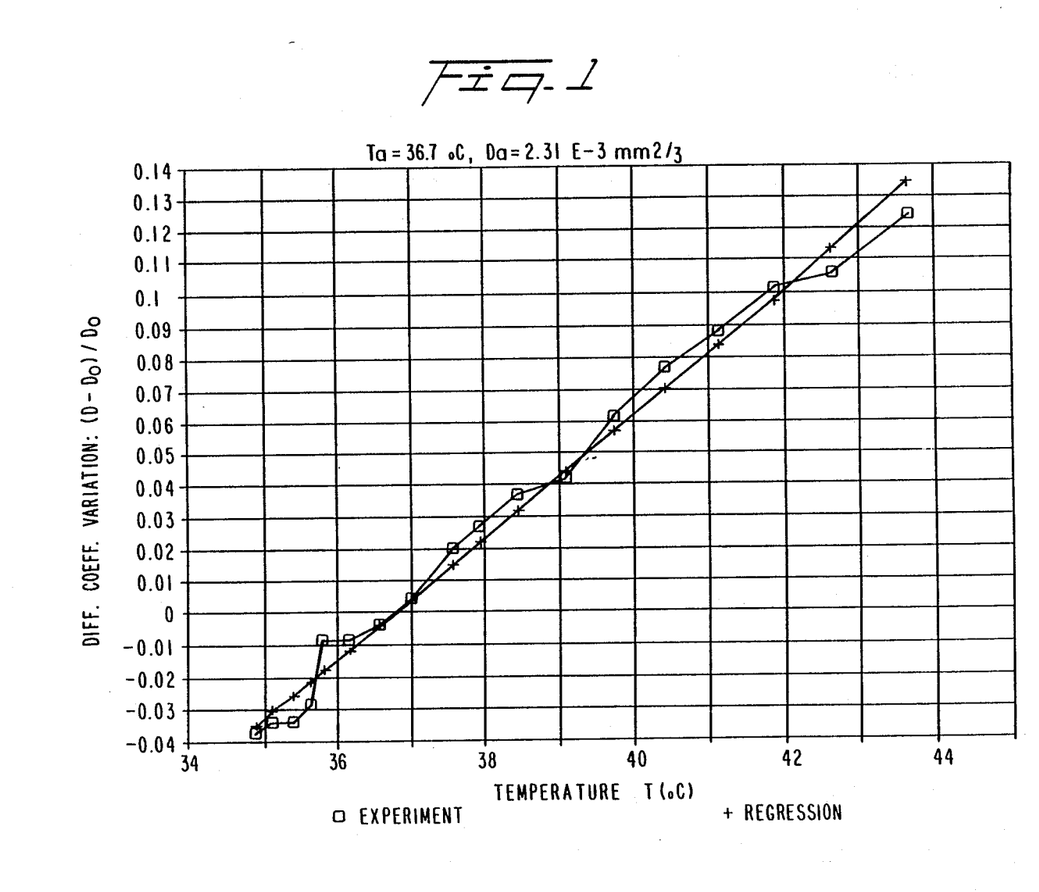
FIG. 1 shows the relative variation of the diffusion coefficient as a function of temperature change. $T_o$ is 36.7° C. and $D_o$ is $2.31 \times 10^{-3}$ mm$^2$/s.
Figure 2:
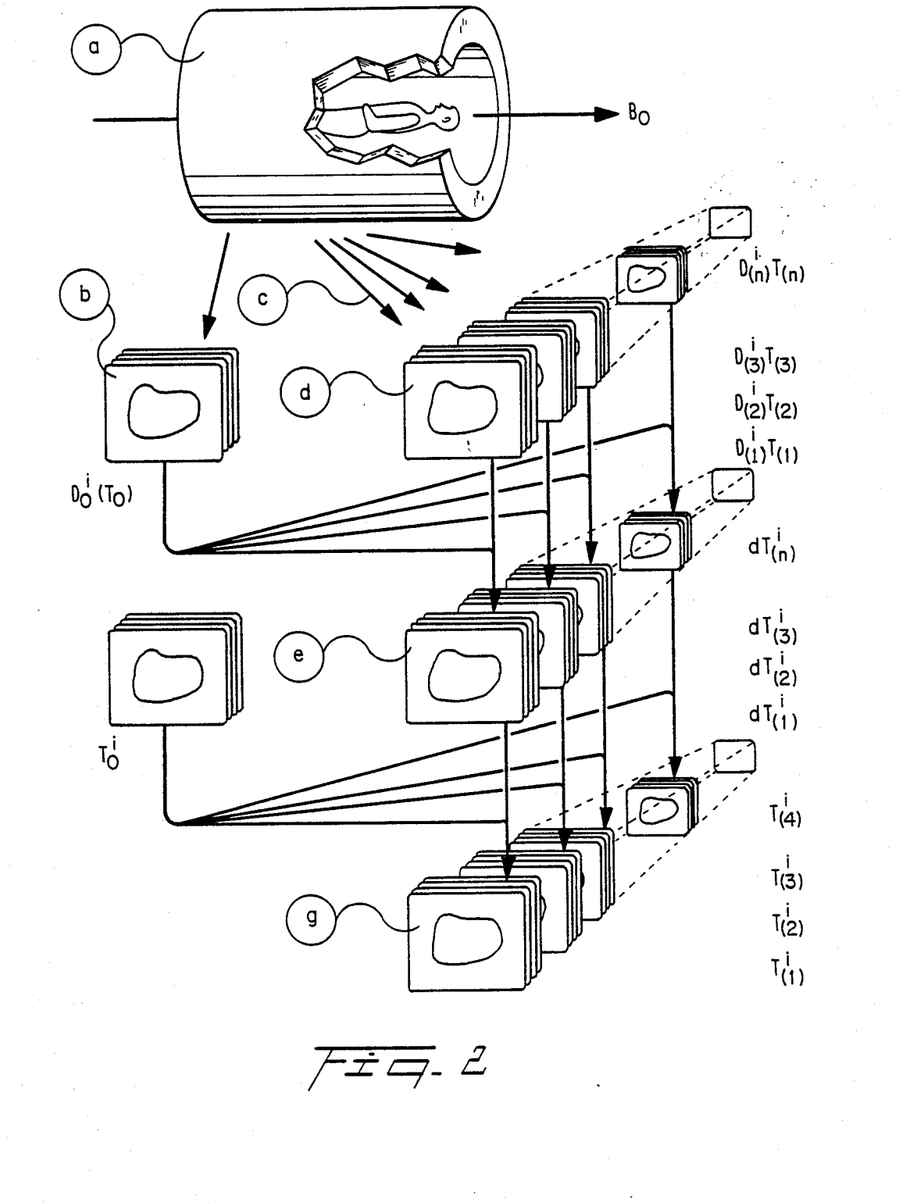
FIG. 2 shows a schematic representation of the method of the invention. Letters a through g correspond to respective steps (a) through (g) in the claims.

A plot of the relative change (D−Do)/Do in the diffusion coefficient with (T−To) is shown in FIG. 1 (corresponding to the second test). As expected, the relation is found to be linear. The activation energy E of water in the gel is obtained from the slope of the plot using equation (3) above. The values obtained are 0.212±0.004 eV at To=23.8° C. and 0.54±0.004 eV to To=36.7° C. The values obtained agree very well with published data (0.21 eV at 20° C.) normally associated with the diffusion coefficient of water (Simpson, J. H., Carr, H. Y., Phys. Rev. 111:1201−1202 (1958)).

The diffusion coefficient Do is 1.76 10³ mm²/s and 2.22 10³ mm²/s at 23.8° C. and 36.7° C., respectively. The measurement error in determining the relative change in the diffusion coefficients D using 0.8 cm² ROIs is 1% which corresponds to a 0.5° C. uncertainty for the temperature.

The invention now being fully described, it will be apparent to one of ordinary skill in the art that many changes and modifications can be made thereto without departing from the spirit or scope of the invention as set forth herein.

We claim:

1. A method of determining and imaging the temperature or the temperature change of an object by nuclear magnetic resonance (NMR), comprising (a) placing the object in a magnetic field $B_o$ at a temperature $T_o{}^i$;

(b) subjecting the thus positioned object or a limited volume thereof to a first series of NMR imaging sequences and recording the first series of images to obtain first numerical values or images of molecular diffusion coefficients $D_o{}^i$ for various points of the object or of the limited volume thereof;

(c) maintaining the object or limited volume thereof at a temperature $T^i$ or waiting for a spontaneous change to said temperature to occur;

(d) subjecting the thus positioned object to a second series of magnetic resonance imaging sequences and recording the second series of images to obtain second numerical values or images of molecular diffusion coefficients $D^i$ for the same points of the object or the limited volume thereof measured in step (b);

(e) comparing point-by-point the values or images of the diffusion coefficients $D_o{}^i$ obtained in step (b) with the values or images of the diffusion coefficients $D^i$ obtained in step (d) to generate a third series of values or images and recording the third series of images representing temperature changes $dT_i$ between steps (b) and (d) for each point of the object or the limited volume thereof measured in steps (b) and (d) from the formula $$dT_i = (dT_o{}^2/E) \text{Log}(D^i/D_o{}^i)$$

wherein k is Boltzman's constant (1.38 10⁻²³ J/K), and E is the activation energy (≈0.2 eV at 20° C.), provided $dT << T_o{}^i$ and $E \approx$ constant;

(f) repeating steps (c) to (e) so that temperature changes $dT_i$ can be monitored; and (g) determining the absolute temperature $T_o{}^i$ for each measured point of the object or the limited volume of the object and obtaining the absolute temperature $T^i$ for each measured point from the formula $T^i = T_o{}^i + dT_i$.

2. The method of claim 1, wherein
the diffusion coefficients $D^i$ and $D_o{}^i$ are determined or imaged from NMR Spin-Echo sequences.

3. The method of claim 1, wherein
the diffusion coefficients $D^i$ and $D_o{}^i$ are determined or imaged from NMR Stimulated Echo sequences.

4. The method of claim 1, wherein
the diffusion coefficients D and Do are determined or imaged from NMR Steady-State Free Precession sequences.

5. The method of claim 1, wherein
the object is selected from the group consisting of solid and liquid objects.

6. The method of claim 1, wherein
the object is selected from the group consisting of living objects and tissues.

7. The method of claim 6, wherein the living object is an animal.

8. The method of claim 6, wherein the animal is a human.

9. The method of claim 6, wherein
when the object is a living object the NMR excitation sequences to which the object is subjected and the recording of the series of images in steps (b) and (d) are synchronized with the heart beat of the living object.

10. The method of claim 7, wherein
in steps (b) and (d) the object is subjected to NMR imaging sequences of long or powerful field gradient pulses.

11. The method of claim 1, wherein
the steps (c) through (g) are repeated at a present time interval to obtain $T^i$ values at different time points.

12. The method of claim 1, wherein steps (c) through (g) are repeated in a continuous manner.

13. The method of claim 1, wherein images and temperatures obtained in steps (b), (d), (e) and (g) are selected from the group consisting of one-, two- and three-dimensional images and temperatures.

14. The method of claim 13, wherein the diffusion values or images, and the temperature images derived therefrom are obtained for any desired part of the object.

15. The method of claim 13, wherein the diffusion values or images, and the temperature images obtained therefrom are obtained for any orientation of the object.

16. The method of claim 1 being used to determine the overall thermal state or thermal change of an object.

17. The method of claim 1 being used to determine a thermal state or a thermal change in an animal.

18. The method of claim 1 being used to determine the temperature of a medium comprising a compound selected from the group consisting of water, fat molecules, lactates, lactic acid, $^{31}P$ compounds, $^{13}C$ compounds and $^{13}F$ compounds.

19. The method for claim 18, wherein the compound is water.

* * * * *